Figure 1:
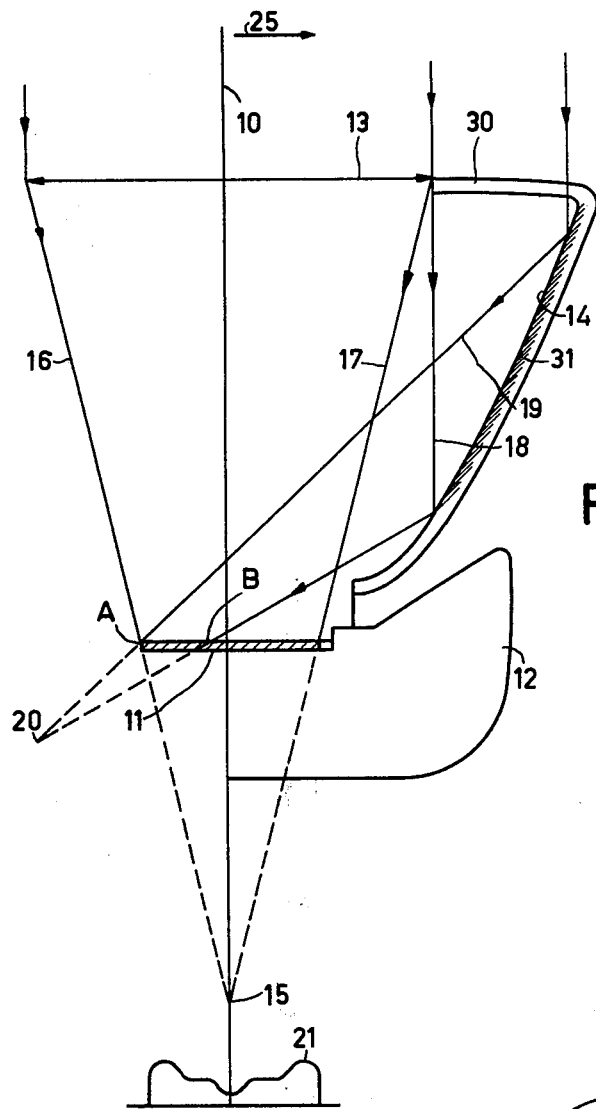

United States Patent [19]

Bellugue

[11] 4,253,880
[45] Mar. 3, 1981

[54] DEVICE FOR THE CONVERSION OF SOLAR ENERGY INTO ELECTRICAL ENERGY

[75] Inventor: Jacques Bellugue, Paris, France

[73] Assignee: U.S. Philips Corporation, New York, N.Y.

[21] Appl. No.: 939,697

[22] Filed: Sep. 5, 1978

[30] Foreign Application Priority Data

Sep. 23, 1977 [FR] France .................. 77 28777
Sep. 23, 1977 [FR] France .................. 77 28779

[51] Int. Cl.³ .......................................... H01L 31/00
[52] U.S. Cl. ..................... 136/259; 350/442; 350/445; 350/293; 250/216
[58] Field of Search ............... 136/89 CA, 89 PC; 250/216; 350/293, 199, 200, 202

[56] References Cited

U.S. PATENT DOCUMENTS

| | | | |
|---|---|---|---|
| 3,162,766 | 12/1964 | Ploke .................. | 250/229 |
| 4,114,592 | 9/1978 | Winston .................. | 126/439 |
| 4,115,149 | 9/1978 | Bell .................. | 136/89 PC |
| 4,131,485 | 12/1978 | Meinel et al. .................. | 136/89 PC |
| 4,146,408 | 3/1979 | Nelson .................. | 136/89 PC |
| 4,166,917 | 9/1979 | Dorfeld et al. .................. | 136/89 CA |
| 4,177,083 | 12/1979 | Kennedy .................. | 136/89 CA |

OTHER PUBLICATIONS

J. Cacheux et al., "High Efficiency GaAlAs/GaAs/Ge Heterostructure Solar Cells . . . ", Proceedings Int'l. Photovoltaic Solar Energy Conf., Luxembourg, Sep. 1977, Reidel Publishing Co. (1978), pp. 1089–1099.

*Primary Examiner*—Aaron Weisstuch
*Attorney, Agent, or Firm*—Thomas A. Briody; William J. Streeter; Algy Tamoshunas

[57] ABSTRACT

A device is described for the conversion of solar energy into electrical energy with the aid of a photo-voltaic cell. A central lens forms a round radiation spot on the radiation-sensitive area of the cell, while a toric mirror arranged round the lens forms an annular radiation spot. Thus, it is ensured that the entire area of the cell remains illuminated, independent of the movement of the sun relative to the cell. Owing to the selected intensity distribution in the radiation spots a satisfactory efficiency of the cell can be maintained even at a high concentration of the solar energy.

4 Claims, 2 Drawing Figures

DEVICE FOR THE CONVERSION OF SOLAR ENERGY INTO ELECTRICAL ENERGY

The invention relates to a device for the conversion of solar energy into electrical energy, comprising a radiation-sensitive cell and optical means for concentrating the solar radiation onto the cell.

The use of optical concentration means enables the surface area of the radiation-sensitive cell to be reduced for the same amount of incident solar energy. A specific amount of electrical energy can then be obtained by means of smaller cells and thus at reduced cost.

However, if the position of the cell relative to the radiation spot, which is formed in the plane of the cell by the concentration means and whose size is approximately the same as that of the cell has changed, a part of the cell is not illuminated, so that the cell no longer functions in an optimum manner. However, for an optimum efficiency of the cell failure to illuminate a part of the cell should be avoided. The displacement of the radiation spot relative to the cell is caused by the movement of the sun relative to the cell. The movement of the sun, especially in the case of a strong concentration of the radiation on the cell, cannot readily be followed mechanically with the required accuracy and demands the use of an expensive tracking system. During the movement of the sun the axis of the tracking system may become misaligned relative to the center of the sun. If the optical element for concentrating the solar energy takes the form of a solid of revolution and forms a round radiation spot in the plane of the cell, which spot has a size equal to the radiation-sensitive area of the cell, a crescent-shaped portion of the cell will not be illuminated in the case of a misalignment.

This problem can be avoided, in a known manner, by concentrating the solar radiation to a spot which is larger than the cell area. This increases the alignment tolerance, but reduces the efficiency of the conversion of solar energy into electrical energy. Said tolerance decreases as the concentration of solar energy increases.

Another problem associated with the concentration of solar energy onto a radiation-sensitive cell is that the temperature of the cell becomes higher than in the absence of any concentration. As is known, the efficiency of the cell decreases as its temperature increases. In the case of a homogeneous illumination of the cell the temperature in the center of the cell will by higher than at the periphery, because heat can be removed more readily from the peripheral portions than from the central portion.

It is the object of the present invention to provide a device having a large alignment tolerance even in the case of a strong concentration of the solar energy. The device in accordance with the invention is characterized in that the optical means are constituted by a central lens and an annular toric mirror, that said mirror forms an annular radiation spot in the plane of the cell, whose outer circumference coincides with the circumference of the cell in the case of a correct alignment, that a sector of the toric mirror illuminates a sector of the cell which is, relative to the optical axis of the lens-mirror system, disposed opposite the said sector of the toric mirror and that the lens forms a radiation spot in the plane of the cell, whose area is equal to the radiation-sensitive area of the cell.

The lens and the toric mirror each form a radiation spot in the plane of the cell, whose dimensions are substantially equal to those of the cell. In the case of a change in the direction of the system axis relative to the direction of the solar radiation the radiation spots move in opposite directions, in such a way that every part of the cell is always illuminated. The optical axis of the mirror coincides with that lens. This axis is the optical axis of the device.

As the toric mirror only illuminates an annular area of the cell, and not the central portion of the cell, the central portion will become less hot than the peripheral portions of the cell. Since heat can be removed more readily from the periphery than from the center, the efficiency of the cell is increased by illumination with an annular instead of a round radiation spot.

A further improvement can be obtained by designing the central lens in such a way that the radiation energy in the center of the round radiation spot formed by said lens is smaller than at the periphery.

Preferably, the marginal rays which are intercepted by the toric mirror make an angle of 45° with said axis after reflection by said mirror. The alignment accuracy to be observed is then minimal with an acceptable reduction of the conversion efficiency.

Figure 2:
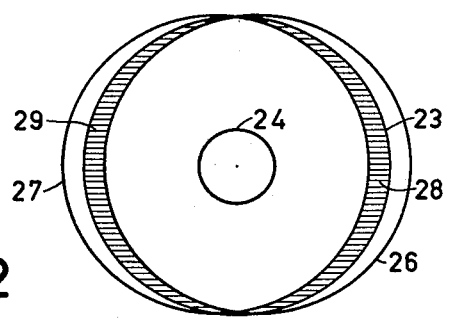

The invention will now be described in more detail with reference to the drawing, in which:

FIG. 1 is a cross-sectional view of an embodiment of a device in accordance with the invention, and FIG. 2 illustrates how the radiation spots formed by the lens and the mirror are displaced when the orientation of the solar radiation changes.

In FIG. 1 the reference numeral 10 designates the axis of the optical system comprising the lens 13 and the mirror 14. The reference numeral 11 refers to the radiation-sensitive or photo-voltaic cell, which may be connected to a heat sink 12. The lens 13 may be a Fresnel lens. The mirror 14 is rotation symmetrical about the axis 10. The shape of this mirror depends on the desired degree of concentration of solar energy onto the cell. The generatrix of the mirror 14 is for example a parabola. In FIG. 1 the solar radiation is incident from the top and the underside of the cell is not exposed, so that the heat developed in the cell can be removed via the underside. The focus of the lens 13 is situated underneath the cell, in such a way that the entire area of the cell is exposed via the lens.

Preferably, the lens 13 is designed so that the radiation intensity in the center of the radiation spot formed by said lens is smaller than at the periphery. The toric mirror 14 illuminates an annular area of the cell. A specific sector of the mirror then illuminates a sector of the annular area on the cell which is disposed opposite the axis 10 in such a way that that part of the mirror which is most remote from the axis reflects the radiation to that part of the cell which is also most remote from the axis. In FIG. 1 the marginal rays 18 and 19 reflected by the mirror 14 illuminate an area A/B of the cell. If, as has been assumed for FIG. 1, the mirror 14 is parabolic, 20 is the focus of this mirror.

The toric mirror 14 has been designed in such a way that the solar radiation intercepted by this mirror is concentrated in an annular area. The central portion of the cell is thus not exposed to radiation from the mirror 14. The lens 13 and the mirror 14 together ensure that the radiation intensity on the cell is distributed as is represented by the curve 21 in FIG. 1. The radiation intensity is a minimum in the center of the cell and increases towards the periphery. This ensures satisfactory removal of heat from the cell and enables a high efficiency of the cell to be attained.

In FIG. 2 the radiation-sensitive area of the cell is represented by the circle 23. The circumference of the round radiation spot formed by the lens 13 coincides with the circle 23 if the system is aimed correctly at the sun. In the case of correct alignment relative to the sun, the annular radiation spot which is formed by the mirror 14 is bounded by the outer circle 23 and the inner circle 24.

If the beam of solar radiation shifts relative to the system in the direction indicated by the arrow 25 in FIG. 1, the radiation spots will move relative to the cell. The radiation spot formed by the lens 13 moves to the right, so that its outer circumference is bounded by the circle 26. The radiation spot formed by the mirror 14 moves to the left, so that its outer circumference is bounded by the circle 27. Thus, the entire cell area is always illuminated.

Preferably, the toric mirror has such dimensions that the marginal rays, i.e. the ray 19 and the rays which are symmetrical thereto relative to the axis 10, make an angle of 45° with the axis 10 after reflection by the mirror. The required alignment accuracy is then minimal for a given acceptable reduction of the conversion efficiency.

Furthermore, it is advantageous if the outer diameter of the mirror 14 and the diameter of the lens 13 are in a ratio of $\sqrt{2}:1$. In the case of an alignment error the two crescent-shaped areas 28 and 29, which are shown hatched in FIG. 2 and which are illuminated only by either the lens 13 or the mirror 14, receive a radiation intensity which is half the intensity received by the portions 28 and 29 in the case of a correct alignment. The cell can then still operate satisfactorily and reliably at this reduced intensity.

The device in accordance with the invention may for example be realized in a manner similar to that described in the copending French Patent Application No. 77 28778. The device then takes the form of a glass bulb, such as a light bulb or a cathode ray television tube, the front surface being provided with a lens which is surrounded by a flat or non-flat ring 30 with parallel faces. The toric mirror of the device is constituted by a reflecting portion of the surface 31 of the bulb.

What is claimed is:

1. A device for concentrating radiant energy such as solar energy or the like onto a radiation-sensitive cell, said device comprising a radiation sensitive cell and optical means including a central lens and an annular toric mirror positioned to form from radiation incident thereon an annular radiation spot in the plane of the cell such that the outer periphery of said annular spot coincides with the periphery of the cell in the case of correct alignment and arranged so that a sector of the toric mirror illuminates a sector of the cell which is disposed opposite said sector of said mirror relative to the optical axis of the lens-mirror system, and said lens being positioned to form from radiation incident thereon a radiation spot in the plane of the cell of an area which is substantially equal to the radiation-sensitive area of said cell so that the resultant radiation spot formed on said cell by said lens-mirror system has a radiation intensity which is smaller in the center than at the periphery.

2. A device as claimed in claim 1, wherein the generatrix of the toric mirror is a parabola.

3. A device as claimed in claim 1 or 2, wherein the lens and the mirror form part of a glass bulb, resembling the shape of a cathode-ray tube, the lens being disposed in the front plane of the bulb and the mirror comprising a reflecting portion of the surface of the bulb.

4. A device for concentrating radiant energy, such as solar energy or the like, onto a radiation-sensitive cell, said device comprising a radiation sensitive cell and optical means including a central lens and an annular toric mirror, the ratio of the outer diameter of said mirror and the diameter of said lens being substantially equal to $\sqrt{2}:1$, said mirror being positioned to form from radiation incident thereon an annular radiation spot in the plane of the cell such that the outer periphery of said annular spot coincides with the periphery of the cell in the case of correct alignment and being arranged so that a sector of said mirror illuminates a sector of the cell which is disposed opposite said sector of said mirror relative to the optical axis of the lens-mirror system, and said lens being positioned to form from radiation incident thereon a radiation spot in the plane of the cell of an area which is substantially equal to the radiation-sensitive area of said cell.

* * * * *